US009053265B2

(12) United States Patent
Nodine

(10) Patent No.: US 9,053,265 B2
(45) Date of Patent: Jun. 9, 2015

(54) GENERATING TEST BENCHES FOR PRE-SILICON VALIDATION OF RETIMED COMPLEX IC DESIGNS AGAINST A REFERENCE DESIGN

(71) Applicant: Apple Inc., Cupertino, CA (US)

(72) Inventor: Mark H. Nodine, Austin, TX (US)

(73) Assignee: Apple Inc., Cupertino, CA (US)

( * ) Notice: Subject to any disclaimer, the term of this patent is extended or adjusted under 35 U.S.C. 154(b) by 477 days.

(21) Appl. No.: 13/648,734

(22) Filed: Oct. 10, 2012

(65) Prior Publication Data

US 2013/0036392 A1    Feb. 7, 2013

Related U.S. Application Data

(63) Continuation of application No. 13/108,615, filed on May 16, 2011, now Pat. No. 8,310,268, which is a continuation of application No. 12/526,691, filed as application No. PCT/US2008/055587 on Mar. 2, 2008, now Pat. No. 7,956,636.

(60) Provisional application No. 60/893,028, filed on Mar. 5, 2007.

(51) Int. Cl.
   *G06F 17/50*    (2006.01)

(52) U.S. Cl.
   CPC .................. *G06F 17/5022* (2013.01)

(58) Field of Classification Search
   CPC .... A61B 5/7221; A61B 5/05; G06F 17/5022; H04W 76/022; H04W 80/00; G01R 33/465; G01R 33/5601; G01R 33/56366
   See application file for complete search history.

(56) References Cited

U.S. PATENT DOCUMENTS 6,083,269 A    7/2000   Graef et al.
(Continued)

FOREIGN PATENT DOCUMENTS

| JP | 2008117110 A2 | 5/2008 |
| WO | 2008-109481 A2 | 9/2008 |
| WO | 2008/109481 A3 | 10/2008 |

OTHER PUBLICATIONS

Casavant, Albert E., et al., "Property-specific witness graph generation for guided simulation," Proceedings of the conference on Design, automation and test in Europe, Mar. 13-16, 2001, p. 799.
(Continued)

*Primary Examiner* — Tung X Nguyen
(74) *Attorney, Agent, or Firm* — Anthony M. Petro; Meyertons, Hood, Kivlin, Kowert & Goetzel, P.C.

(57) ABSTRACT

This invention (900) described a method that generates and uses a test bench for verifying an electrical design module in a semiconductor manufacturing against an electrical reference model containing a sub-circuit that matches the electrical design module. The invention includes providing (902) a description of an electrical design module that includes a plurality of ports. In addition, the invention includes providing (904) a description of an electrical reference model. The invention further includes providing and or creating (92) one or more implicit defines for the reference modules that appear in hierarchy of the electrical reference model. And, the invention includes providing (906) a description file that includes one or more instance definitions. The invention parses (91) the hierarchy of the electrical design model and then processes (96) the description file. The invention then writes (97) the test bench.

20 Claims, 8 Drawing Sheets

(56) References Cited

U.S. PATENT DOCUMENTS

| | | |
|---|---|---|
| 6,339,837 B1 | 1/2002 | Li |
| 6,460,174 B1 | 10/2002 | Carey |
| 6,591,402 B1 | 7/2003 | Chandra et al. |
| 6,874,135 B2 | 3/2005 | Gupta et al. |
| 6,975,976 B1 | 12/2005 | Sasavant et al. |
| 7,089,517 B2 | 8/2006 | Yamoto et al. |
| 7,100,133 B1 | 8/2006 | Meiyappan et al. |
| 7,216,321 B2 | 5/2007 | Murphy et al. |
| 7,606,694 B1 * | 10/2009 | Carrillo et al. .................. 703/14 |
| 2008/0244482 A1 * | 10/2008 | Chang et al. ...................... 716/5 |
| 2008/0263484 A1 | 10/2008 | Kobayashi |
| 2009/0112554 A1 | 4/2009 | Walter et al. |
| 2011/0214096 A1 | 9/2011 | Sheeley |

OTHER PUBLICATIONS

Da Silva, Karin R.G., et al., "An automatic testbench generation tool for a SystemC functional verification methodology," Proceedings of the 17th Symposium on Integrated Circuits and System Design, Sep. 7-11, 2004, pp. 66-70.

Falconeri, Giuseppe, et al., "Common reusable verification environment for BCA and RTL models," Proceedings of the conference on Design, Automation and Test in Europe, vol. 3, Mar. 7-11, 2005, pp. 272-277.

Gupta, Aarti, et al., "Property-specific testbench generation for guided simulation," Proceedings of the Asia and South Pacific Design Automation Conference, 7th Asia and South Pacific and the 15th International Conference on Very-large-scale Integration Design, Jan. 7-11, 2002, pp. 524-531.

* cited by examiner

GENERATING TEST BENCHES FOR PRE-SILICON VALIDATION OF RETIMED COMPLEX IC DESIGNS AGAINST A REFERENCE DESIGN

This application is a continuation of U.S. patent application Ser. No. 13/108,615, filed May 16, 2011, which is a continuation of U.S. patent application Ser. No. 12/526,691, filed Aug. 11, 2009, which is the National Stage of International Application No. PCT/US2008/055587, filed Mar. 2, 2008, which claims benefit of priority of U.S. Provisional Patent Application No. 60/893,028, filed Mar. 5, 2007, each of which is incorporated by reference herein in its entirety.

TECHNICAL FIELD

The present invention relates to generating test benches for integrated circuit designs. More specifically, the present invention relates to generating test benches for pre-silicon validation of retimed complex IC designs against a reference design.

BACKGROUND ART

Functional validation (verification) of complex IC designs is an activity that currently consumes a majority of the engineering man-hours for creating a semiconductor design. Verification entails checking the output of a design implementation with that expected by a design reference model. The checking can be either at an abstract level using a high-level reference model, or it can involve checking signals on a cycle-by-cycle basis against a cycle-accurate reference model. The validation process depends upon having two independently-created implementations of the same specification to reduce the probability that a violation of the specification is accepted due to a common-mode failure in both the implementations.

This invention pertains to checking a plurality of design modules against a plurality of modules within a cycle-accurate reference model. The use of cycle-accurate reference models is unusual within the industry because:
1. There is a considerable overhead involved in maintaining a cycle-accurate reference model beyond that for maintaining an abstract reference model. This overhead increases proportionately to the degree of flux of the architectural specification of the design.
2. Implementing a new architecture requires a parallel effort to create a cycle-accurate reference model; this parallel effort has approximately the same degree of difficulty as the implementation being tested for the architecture.
3. In cases where a re-implementation occurs of an existing architecture, the original implementation cannot usually be used as a reference model since there are usually changes to the feature set, such as adding new features or fixing defects, that render the original implementation inaccurate as a reference model.

Thus, the current invention is useful only when a cycle-accurate implementation of a stable architecture can be used as a reference model for a re-implementation of that architecture.

Since validation occupies such a time-consuming portion of the development of complex ICs, it is important to begin the validation process as soon as possible in the design cycle. The present invention greatly facilitates the early testing of design modules by automating the repetitive task of generating test benches. Furthermore, our method uses description files to specify how the testing of a design module is to proceed; these description files act as a precise definition of the interfaces between design modules.

This application claims the benefits of the earlier filed U.S. Provisional Application Ser. No. 60/893,028, filed 5 Mar. 2007, which is incorporated by reference for all purposes into this specification.

BEST MODE FOR CARRYING OUT THE INVENTION

This invention describes a method that generates and uses a test bench for verifying an electrical design module in semiconductor manufacturing against an electrical reference model containing a sub-circuit that matches the electrical design module. The invention comprises providing a description of an electrical design module that includes a plurality of ports. In addition, the invention includes providing a description of an electrical reference model that comprises a hierarchy of one or more reference modules where each reference module comprises a plurality of ports and a plurality of internal wires. The invention further includes providing and or creating one or more implicit defines for the reference modules that appear in hierarchy of the electrical reference model where each implicit define comprises a path through the hierarchy of the electrical reference model to the module so defined. And, the invention includes providing a description file that includes one or more instance definitions, wherein each instance definition contains a plurality of port definitions, each port definition contains the name of a port of the electrical design module and a reference connection, the reference connection contains the name of a single implicit define being also the name of a module within the electrical reference model and the name of the port on the module within the electrical reference model. The invention parses the hierarchy of the electrical design model and then processes the description file. The invention then writes the test bench containing logic to drive each input port of the electrical design module with the port of the reference module to which it maps and to check at each clock cycle each output port of the electrical design module against the port of the reference module to which it maps and to record in the test bench that each of the plurality of ports of the electrical design module matches its corresponding port of the reference module.

Further refining the invention, the implicit defines are generated for each reference module that appears uniquely in the hierarchy of the electrical reference model. In addition, the reference connection comprises the name of an implicit define and the name of an internal wire in the module within the electrical reference model. Further, each said port definition within the description file further specifies an encoding function to apply to the reference connection. Additionally, each port definition further specifies that the reference connection be delayed by an integral number of clock cycles. Further, each port definition further specifies that the port on the electrical design model be delayed by an integral number of clock cycles. And, the reference connection specifies a Boolean combination of one or more reference signals where each reference signal comprises a signal or port in the electrical reference module.

BRIEF DESCRIPTION OF DRAWINGS

To further aid in understanding the invention, the attached drawings help illustrate specific features of the invention and the following is a brief description of the attached drawings.

DISCLOSURE OF INVENTION

This disclosure describes generating test benches for pre-silicon validation of retimed complex IC designs against a reference design. This disclosure describes numerous specific details in order to provide a thorough understanding of the present invention. One skilled in the art will appreciate that one may practice the present invention without these specific details. Additionally, this disclosure does not describe some well known items in detail in order not to obscure the present invention.

Figure 1:
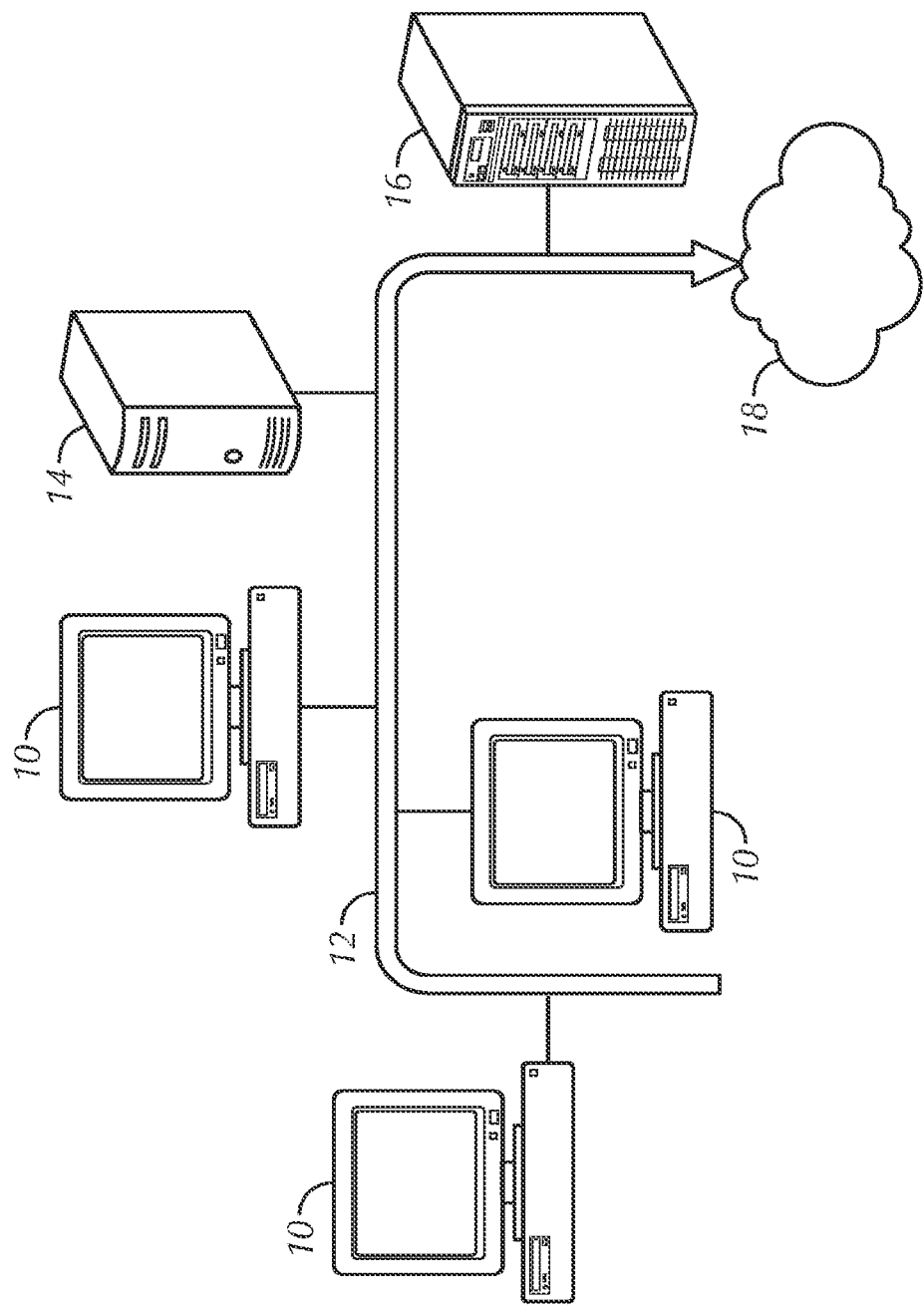
FIG. 1 illustrates the invention in a typical networked environment.

FIG. 1 illustrates the use of the present invention in a typical networked environment. The invention is a software program that runs on one or more workstation 10 in a networked environment. The various workstations 10 couple to a network 12 where they may communicate with each other. Additionally, the networked environment may include a shared storage device 14 and a network server 16. And, the networked environment may couple to the Internet 18. In addition to being able to operate on one or more workstations 10, the invention may use the resources of the shared storage device 14 and the network server 16. The invention may also use resources available through the Internet 18. One embodiment of the invention uses a LINUX based standalone workstation 10 and uses the interpretive language PERL. One skilled in the arts will appreciate the invention is capable of using other languages for operation and that it may be hosted on other operating systems.

The following sections illustrate an exemplary selection of test benches generated using the disclosed invention. The inputs used are the name of a top-level module to be used as a reference model, one or more description files, described below, and optionally, one or more implicit defines. An object of this invention is that all of these test benches can be generated using the same description file(s) for the design module(s) being tested, regardless of which reference model is used for providing stimulus and checking results.

Figure 2:
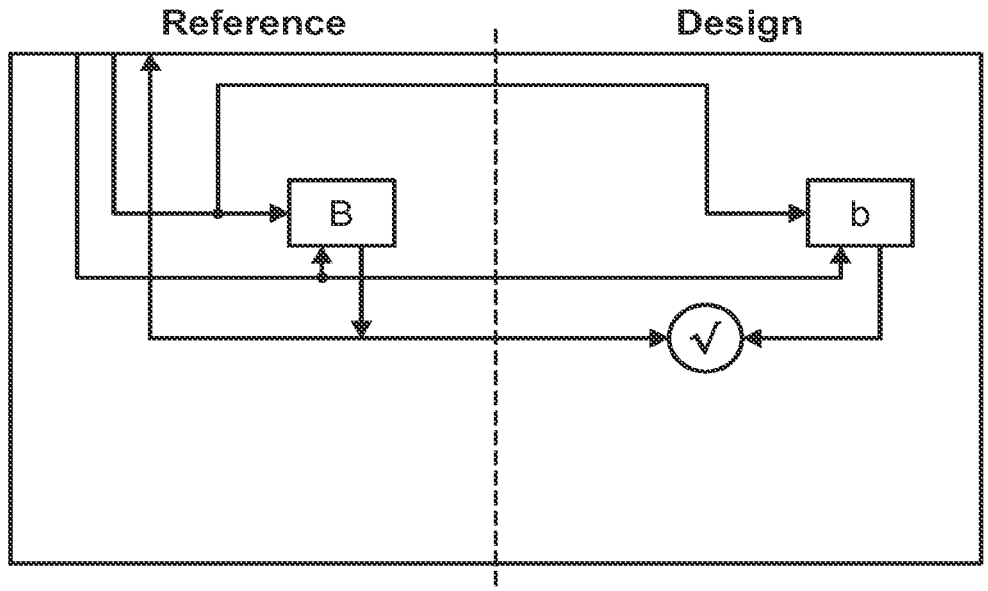
FIG. 2 discloses a test bench to check a unit-level design module against a unit-level reference module.

FIG. 2 discloses a test bench to check a unit-level design module against a unit-level reference module. The simplest form of a test bench that can be generated using the disclosed invention is to test a unit-level design module against a unit-level reference module. Referring back to FIG. 2, the outer boundary represents the generated test bench, which contains instances of reference module B and design module b corresponding to it. The inputs of the test bench drive the inputs of B and the outputs of B are propagated to the outputs of the test bench. Furthermore, the inputs of B are also driven into b so that it sees the identical stimulus. The outputs of both B and b are wired into a checker unit (represented as a check mark within a circle in the figure) to report any mismatches. The thicker lines represent logic generated by the test bench generator, where a box indicates instantiation and a line indicates a wire. To use such a test bench, there must be a unit-level stimulus generator.

Figure 3:
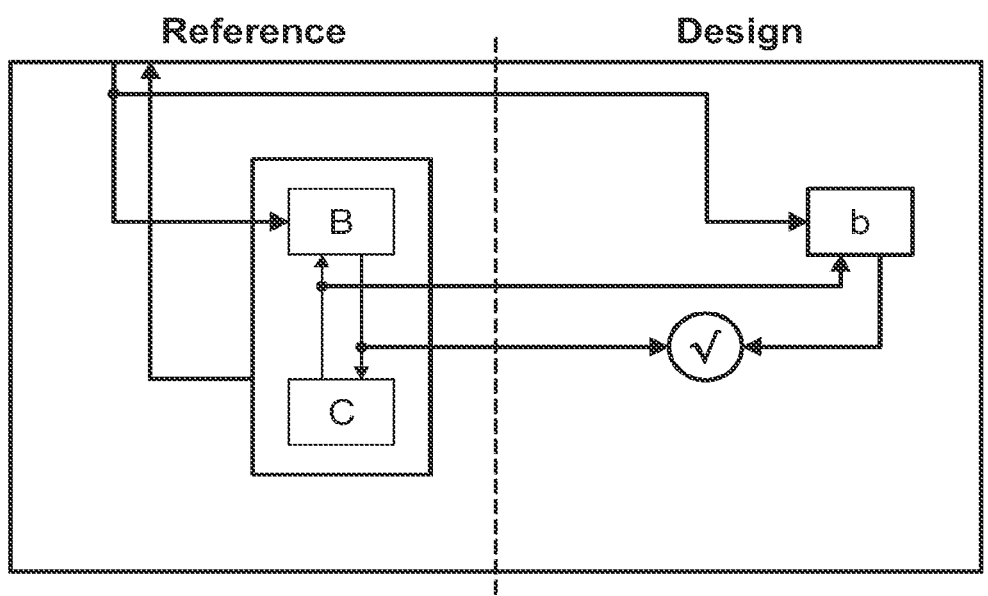
FIG. 3 discloses a test bench to check a unit-level design module against a block-level reference module.

FIG. 3 discloses a test bench to check a unit-level design module against a block-level reference module, which illustrates a more complex test bench generated with the disclosed invention. In this figure, the reference module B is instantiated within a higher-level module that also instantiates reference module C. The inputs and outputs to the generated test bench match those of the higher-level module. The boxes and wires with thinner lines indicate logic that is present within the higher-level module and not generated by the test bench generator. The test bench generator creates wires to drive the inputs of b either from primary inputs to the test bench or from wires within the reference design that drive B. Similarly, the test bench generator checks the outputs of b against the outputs of those internal wires driven by B in the higher-level design.

Figure 4:
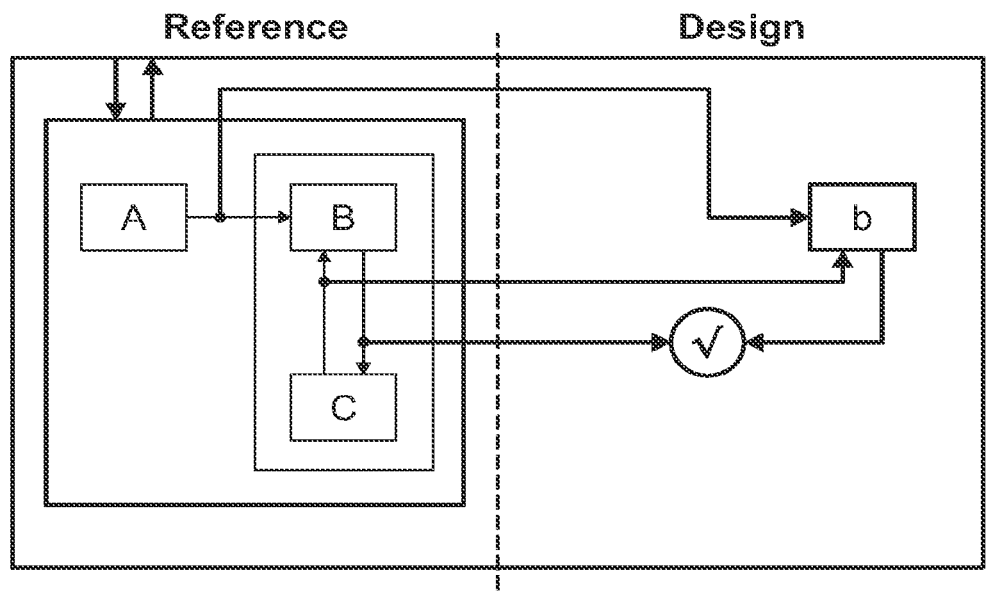
FIG. 4 discloses a test bench to check a unit-level design module against a chip-level reference module.

FIG. 4 discloses a test bench to check a unit-level design module against a chip-level reference module. The natural extension of these test benches is to use the reference model for an entire chip to test a unit-level module in the design as shown schematically in this figure. In fact, conceptually the extensions can go even beyond the chip level, for example, to multiple processors in a symmetric multiprocessing system.

Figure 5:
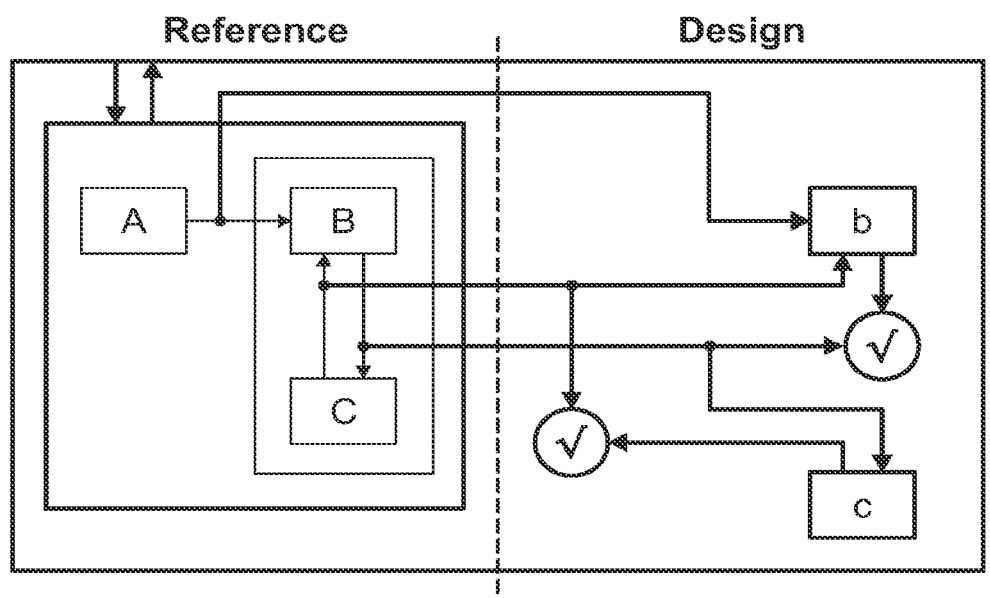
FIG. 5 discloses a test bench to check two unit-level design modules against a chip-level reference module.

FIG. 5 discloses a test bench to check two unit-level design modules against a chip-level reference module. Another way that the test benches can be extended is to allow for testing of multiple design modules independently in the same test bench as illustrated in this figure. This extension uses the same description files for design modules b and c as would be used in their unit-level test benches.

Figure 6:
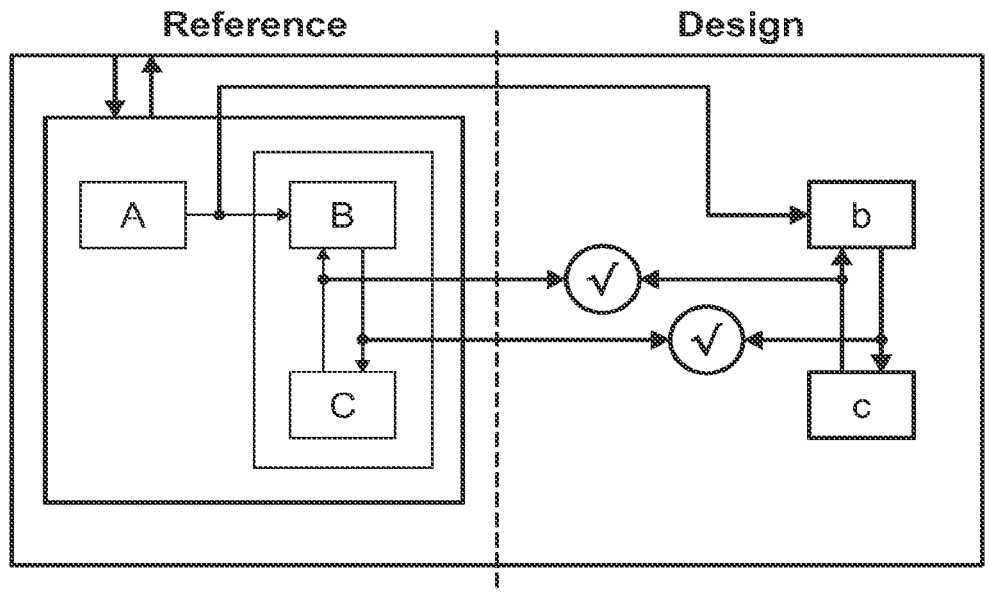
FIG. 6 discloses a test bench in which some ports of design modules are wired together and tested against a chip-level reference module.

FIG. 6 discloses a test bench where some ports of the design modules are wired together and tested against a chip-level reference module. When adjacent modules in a design have both been tested, it can be convenient to produce a test bench in which the outputs of one design module are wired to the inputs of another design module that consume them, as illustrated in this figure. The description files for b and c can be used for generating this test bench without changes, but an additional description file is needed to override the driving of the input ports that are driven from a local instance.

Figure 7:
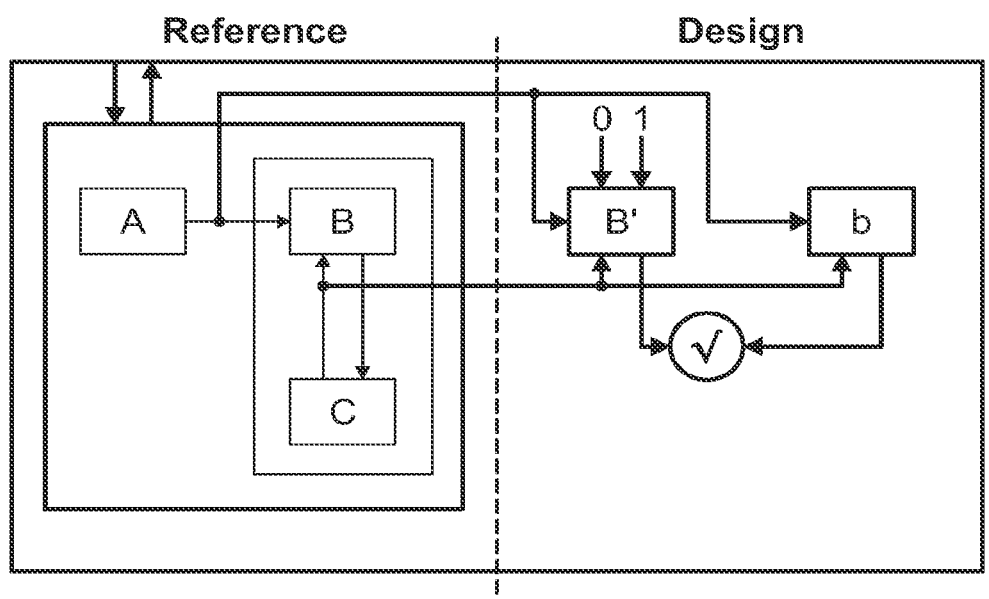
FIG. 7 discloses a test bench to check a unit-level design module against a reference module with functionality reduced by driving one or more inputs with constant values and the remaining inputs with those of the corresponding reference module in a chip-level reference module.

FIG. 7 discloses a test bench to check a unit-level design module against a reference module with functionality reduced by driving one or more inputs with constant values and the remaining inputs with those of the corresponding reference module in a chip-level reference module. The purpose of using automatically-generated test benches is to begin testing as early as possible in the design cycle. Sometimes it is desired to begin testing before all the features of the design module have been implemented. If the unimplemented features can be disabled in the corresponding reference module by driving some inputs with constant values (i.e., logic 0 or 1), then the result is a test bench as illustrated in this figure. Here, an additional instance of reference module B, called B' has been instantiated in the test bench with certain inputs driven from constant values. The outputs of design module b are checked against those of B'. While reference module B may receive inputs that b is unable to handle, module B' behaves as though those inputs had not occurred so that the outputs of b can be checked. The description file used for testing b against the full design can be used for generating this test bench without changes, but an additional description file is needed to instantiate B'.

Figure 8:
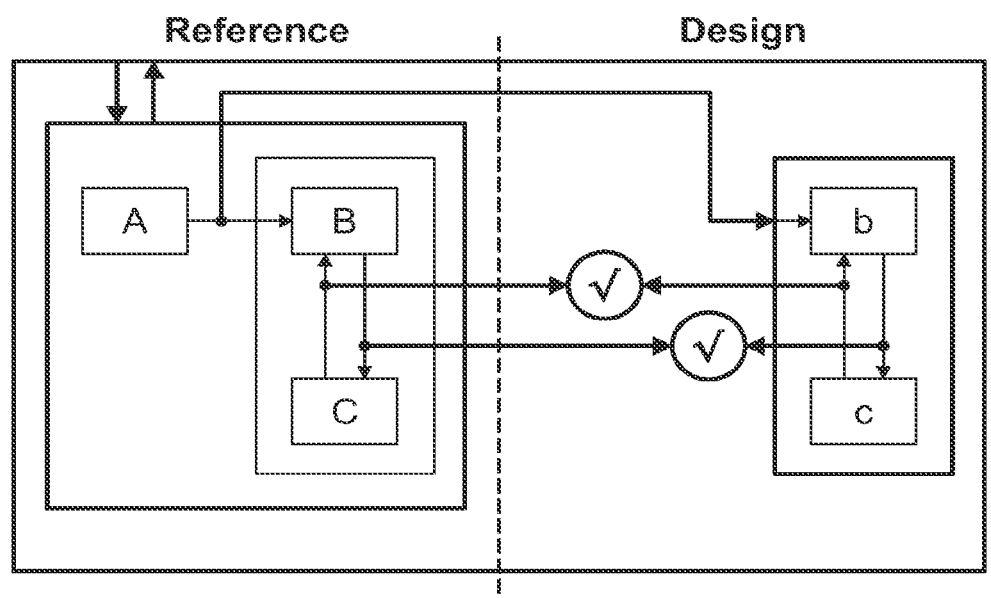
FIG. 8 discloses a test bench to check a block-level design module against a chip-level reference module.

FIG. 8 discloses a test bench to check a block-level design module against a chip-level reference module. Eventually, the design modules are composed hierarchically into higher-level modules (blocks). When the modules to be tested (b and c in this example) are instantiated within a higher-level design module, there is no reason to drive their inputs directly. However, the disclosed invention uses the description files to generate checkers for the design modules by propagating the values from the internal wires driven by the design modules to the test bench for comparison against those of the reference model. These checkers can be created with no change to the description files that would be used for doing unit-level checking.

In the above examples, the description files have no dependence upon what the reference model is except that the reference model must contain modules of the appropriate type. In addition, the above examples all assume that there is a perfect correspondence between a reference module and a design module. In practice, this is often not the case.

An important innovation of the disclosed invention is the use of implicit defines to make the description file for a design module independent of the reference model. The inputs are the name of the top-level module to be used as a reference model, a list of one or more description files, and an optional list of one or more implicit defines. Each description file contains the information needed to provide a correspondence between a design file and a plurality of locations in the reference file against which the design file is to be checked. Each location within the reference model may be a network (a\k\a wire), a register, or a port of some module. Each location within the reference model is referenced using the implicit define for the module within the reference model that contains the location.

Figure 9A:
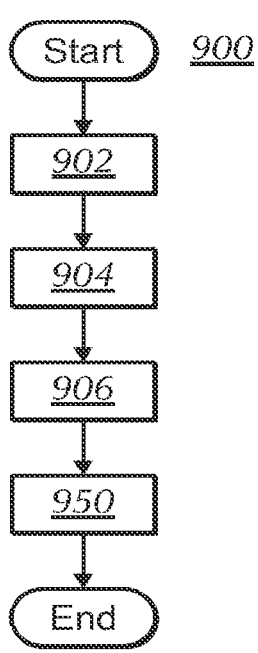
FIG. 9A illustrates the top-level flow chart of the disclosed invention.

FIG. 9A illustrates the top-level flow chart of the disclosed invention. A user of the disclosed invention first provides 902 a description of an electrical design module that includes a plurality of ports. The user next provides 904 a description of an electrical reference model, which comprises a hierarchy of one or more reference modules where each reference module comprises a plurality of ports and a plurality of internal wires. Additionally, the user provides, or the invention creates, 92 one or more implicit defines for the reference modules that appear in the hierarchy of the electrical reference model where each implicit define comprises a path through the hierarchy of the electrical reference model to the module so defined. Next, the user provides 906 a description file that includes one or more instance definitions, wherein each instance definition contains a plurality of port definitions, each port definition contains the name of a port of the electrical design module and a reference connection, the reference connection contains the name of a single implicit define being also the name of a module within the electrical reference model and the name of the port on the module within the electrical reference model.

Figure 9B:
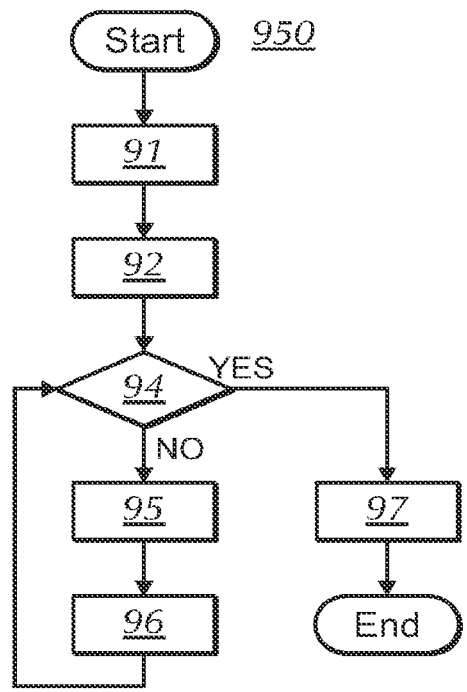
FIG. 9B illustrates the process of step 950 of FIG. 9A.
Figure 10:
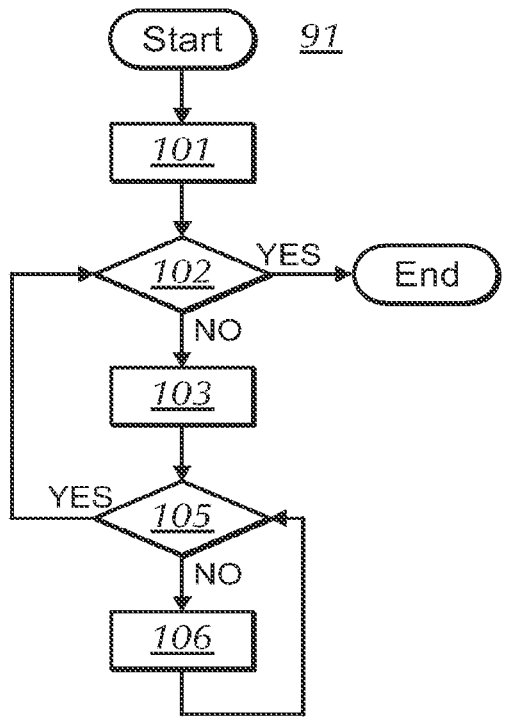
FIG. 10 illustrates the process of step 91 of FIG. 9B.

FIG. 9B illustrates the process of step 950 of FIG. 9A. Here, the disclosed invention traverses 91 the module hierarchy of the reference model. During this traversal, it keeps track, for every module encountered, of the complete hierarchical paths of the instances. FIG. 10, discussed below, further elaborates this step. Referring back to FIG. 9B, the disclosed invention searches 92 through each module that was encountered in traversing 91 the module hierarchy of the reference model and, if there is a unique instance of the module, the invention creates an implicit define that associates the path to the unique instance with the name of the module. The invention also establishes an implicit define for each element of the optional list of implicit defines specified as an input to the invention where the list is used for providing implicit defines for multiply instanced modules in the reference model as needed to test the design module(s). The invention additionally in step 92 initializes the list file_list to contain the names of the definition files that were given in the input and the list path_list to contain one empty string for every element of the list file_list. The two lists, file_list and path_list, are maintained in parallel, with the elements of path_list giving the path within the test bench to the instances of the modules represented by the corresponding elements of file_list. Initially, all instances are at the top level of the test bench, which is why the list path_list contains an empty string for each.

Figures 11, 12:
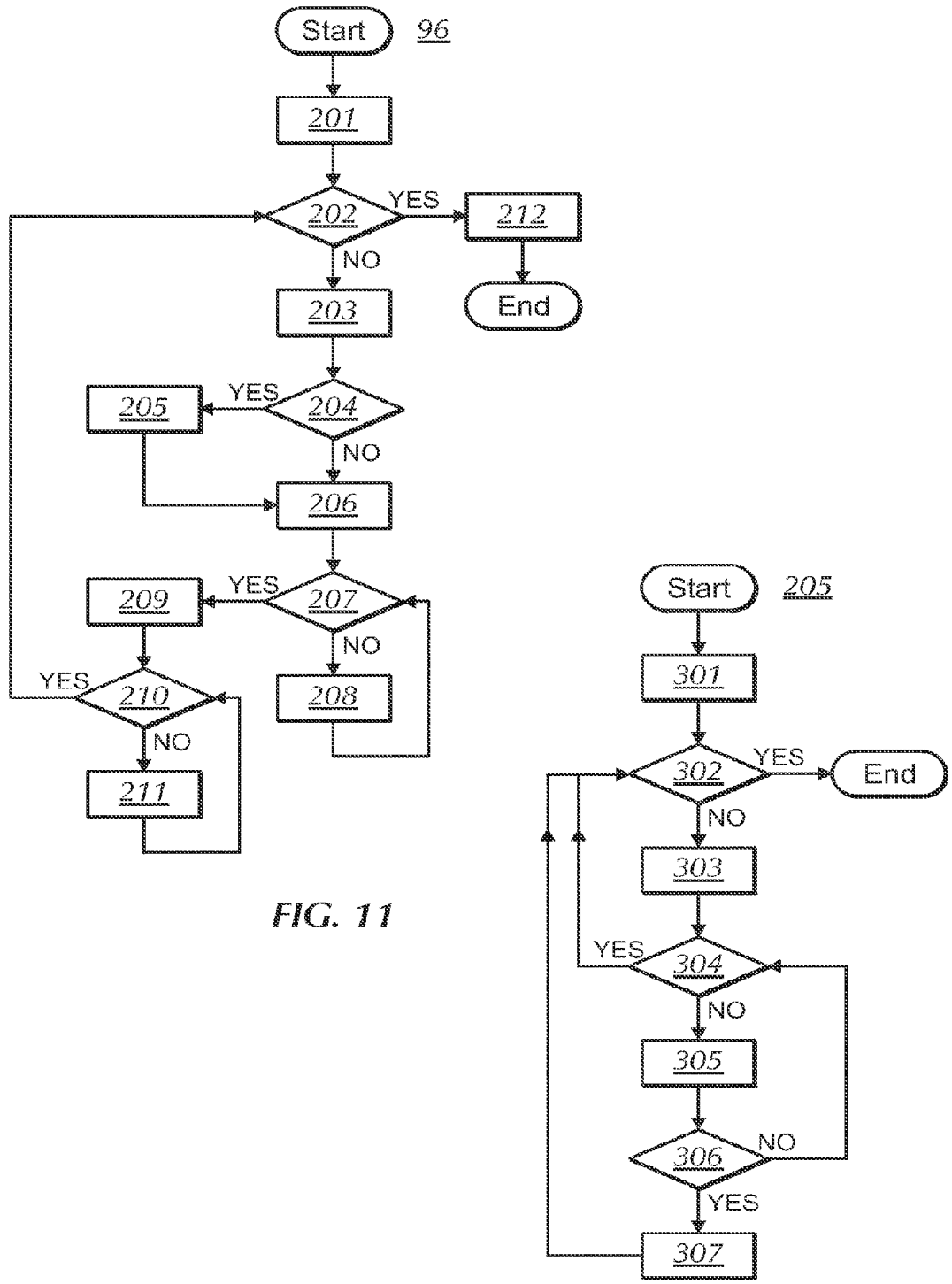
FIG. 11 illustrates the process of step 96 of FIG. 9B.
FIG. 12 illustrates the process of step 205 of FIG. 11.

Next, the disclosed invention checks in step 94 whether list file_list is empty. If it is, the invention proceeds to step 97 to write the test bench file. If it is not, the invention continues to step 95, which removes the first element of list file_list and assigns it to variable next_file and also removes the first element of list path_list and assigns it to variable next_path. The invention then continues to step 96, where it processes the description file next_file with path next_path and returns to step 94. FIG. 11 further illustrates step 96, and FIG. 13 further illustrates step 97.

FIG. 10 illustrates in more detail the traversing of step 91 of FIG. 9B. In step 101, the disclosed inventions initializes the list mods_to_parse of modules that need to be parsed to contain a single element, the name of the top-level module of the reference model and the list path_list2 to contain a single element which is an empty string. The two lists mods_to_parse and path_list2 are maintained in parallel, with the elements of path_list2 giving the path within the reference model to the modules represented by the corresponding elements of mods_to_parse.

In step 102, the invention checks to see if the list mods_to_parse is empty, which it will not be the first time through. If the list mods_to_parse is empty, the invention is finished with step 91. If the list mods_to_parse is not empty, the invention proceeds to step 103 where it removes the first element of list mods_to_parse, assigning it to variable mod and removes the first element of list path_list2 and assign it to the variable path. Next, the invention initializes the list inst_list to contain the instance names of all the instances contained in module mod.

In step 105, the invention checks whether the list inst_list is empty. If it is, then the invention has finished processing module mod and goes back to step 102 to check for any additional modules to parse. If the list inst_list is not empty, the invention continues on to step 106, which does the following:
1. Remove the first element of inst_list and assign it to the variable inst.
2. Assign the module of which instance inst is an instance to the variable inst_mod.
3. Add path.inst to the list of instances of module inst_mod (the period (.) is omitted if the variable path is the empty string).

4. Append inst_mod to the list mods_to_parse and append path.inst to the list path_list2 (again omitting the period if the variable path is the empty string).
5. The invention then goes back to step 105 to check for any additional instances within inst_mod.

The user in the initial step up of the invention provides 906 a description file that contains one or more instance definitions, each of which contains a plurality of port definitions. An instance definition directs the test bench generation method to place an instance in the test bench. The instance can be either an instance of a design module to be tested or an instance of a reference module against which instances of design modules can be tested. (FIG. 7 provides an example of instancing a reference module.) In one embodiment of the disclosed invention, the instance definition can specify a plurality of matching functions to define a reference connection for a plurality of ports (for the definition of a reference connection). In another embodiment of the disclosed invention, the instance definition can specify a plurality of sub-instances of a design module whose outputs should be checked. In a further embodiment of the invention, the instance definition can specify a plurality of checks for internal locations within the design module.

The port definition for an input port describes how the port is to be driven during testing, unless the instance definition represents a sub-instance of a higher level instance that is being processed, in which case the port definition for the input port is ignored. The port definition for an output port describes how the port is to be checked during testing.

A port definition contains the following information:
1. A /name/ for which port is being defined, corresponding to one of the named ports of the design module.
2. A /reference connection/, which establishes a correspondence between the port of the design module and its equivalent in a reference module, which is referred to using an implicit define.
    A. In one embodiment of the invention, the reference connection can be a Boolean combination of one or more locations within one or more reference modules and the Boolean constants 0 and 1.
    B. In another embodiment of the invention, the reference connection for an input port of the design module can be the output port of a different design module for which an instance definition also exists. This embodiment produces a test bench as illustrated in FIG. 6.
3. In one embodiment of the invention an /encoding function/ which specifies how the reference connection is to be encoded to correspond to the port of the design module.
4. In one embodiment of the invention, a /phase/ which specifies on which phase of a multi-phased clock the port of the design module should be driven or checked for input or output ports, respectively.
5. In one embodiment of the invention, a /reference delay/ which specifies by how many clock cycles the reference connection must be delayed to correspond to the port of the design module.
6. In one embodiment of the invention, a /design delay/ which specifies by how many clock cycles the port of the design module must be delayed to correspond to the reference connection.

FIG. 11 further illustrates step 96 of processing the description file. In addition, FIG. 11 also illustrates the process that encompasses all the above embodiments. In step 201, the invention opens the description file next_file (which was set in step 95) and initializes the list inst_list to contain all the instance definitions from description file next_file. In step 202, the invention checks whether list inst_list is empty. If it is, the invention goes to step 212. If it is not, the invention goes to step 203. In step 203, the invention removes the first element of inst_list and assigns it to variable inst. The invention assigns the string next_path.inst to variable inst_path except that it omits the period (.) if the variable next_path, which was set in step 95, is empty. The invention then continues to step 204, where it checks if the instance definition specified a matching function to match ports of the design module to be instanced with ports of some reference instance. If there is no matching function, the invention goes directly to step 206. If there is a matching function, the invention proceeds to step 205, which applies the matching function as illustrated in more detail in FIG. 12, after which the invention continues to step 206. In step 206, the invention initializes list port_list to the set of port definitions that the instance definition for instance inst contains and proceeds to step 207. Step 207 asks whether the list port_list is empty. If it is, then the invention proceeds to step 209. If it is not, then the invention goes to step 208 instead. In step 208, the invention removes the first element of the list port_list and assign it to variable port. The invention then records all the information from the port definition associated with port port into the test bench's database record for the instance inst_path and port port of instance inst_path and returns back to step 207. Next, step 209 initializes the list subinst_list to contain all the sub-instance definitions contained by the instance definition for inst, if allowed by the embodiment of the invention, and proceeds to step 210. In step 210, the invention checks whether the list subinst_list is empty. If it is, the invention returns back to step 202, otherwise the invention proceeds to step 211. Step 211 performs the following operations: (1) it removes the first element of list subinst_list and assigns it to the variable subinst; (2) it appends the name of the module of which subinst is a type to the list file_list for later processing; and (3) it appends inst_path to the list path_list. It then returns to Step 210. Finally, step 212 closes the file next_file.

In one embodiment of the disclosed invention, a matching function can be used to eliminate much of the manual effort in establishing a correspondence between the ports of the design module and the ports of some corresponding module in the reference module, as illustrated by step 204 and step 205 of FIG. 11.

FIG. 12 illustrates the method of step 205 of FIG. 11. In Step 301, the invention gets the list of ports of the instance inst and put it into the list design_ports. The matching function m specifies a reference instance using an implicit define against which instance inst should be matched; then, the invention puts the name of this reference instance into variable ref_inst and proceeds to step 302 and determines if list design_ports is empty; if it is, the invention ends and returns to the prior level. If not, the invention proceeds to step 303. Step 303 removes the first element of list design_ports and assigns it to the variable design_port. Then the list of ports of reference instance ref_inst is put into list ref_ports and the invention goes to step 304, which asks whether the list ref_ports has been fully processed. If it has, the invention returns to step 302. If it has not, then the invention goes on to step 305. In step 305, the invention assigns the next unprocessed element of list ref_ports to the variable ref_port and continues to step 306, in which the invention determines if the design port design_port matches reference port ref_port. The procedure for answering this question is dependent upon the embodiment of the disclosed invention. The simplest procedure requires an exact match between the port names. A slightly more complex procedure checks whether one of the ports is a prefix or suffix of the other. More complicated matching functions are certainly possible, perhaps involving insertion of underscore characters or changing character from upper case to lower case or /vice versa/. Regardless of the matching function used by a particular embodiment of the invention, if the design port design_port does not match reference port ref_port, control reverts to step 304; otherwise the invention goes to step 307. In step 307, the invention records a correspondence to port ref_port of reference instance ref_inst into the test bench record for port design_port of instance inst_path and return to step 302.

Figure 13:
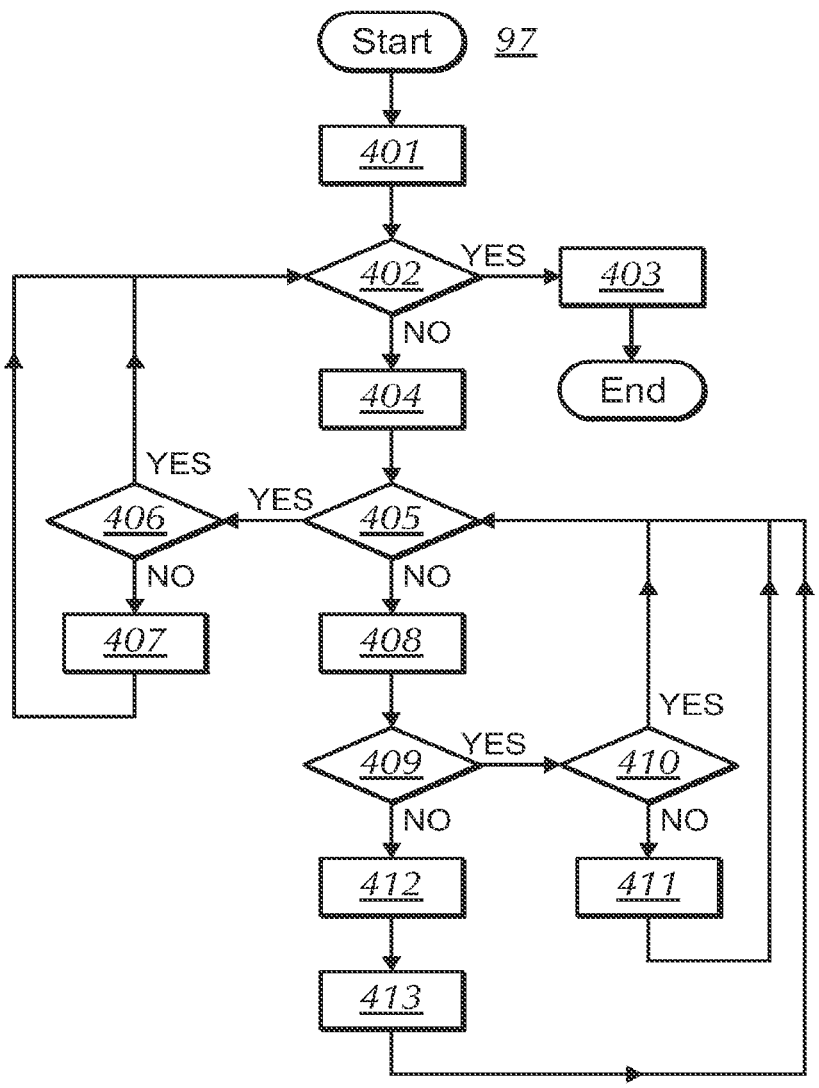
FIG. 13 illustrates the process of step 97 of FIG. 9B.

FIG. 13 illustrates step 97 of FIG. 9B. To create a test bench file, the invention starts in step 401 by writing a module header for the test bench module. The port list of the test bench module exactly matches that of the reference model. The invention also writes an instance of the reference module into the test bench module with its ports wired to those of the test bench module. The invention proceeds to step 402, which asks whether all the instances recorded in the test bench record in step 208 of FIG. 11 and step 307 of FIG. 12 have been processed. If they have, then the invention goes to step 403, which writes the end of the test bench module. If they have not, the invention executes step 404, which assigns the next unprocessed instance to the variable next_inst and goes on to step 405, which checks if all the ports of instance next_inst have been processed. If they have, the invention proceeds to step 406; otherwise the invention proceeds to step 408. Step 406 asks whether instance next_inst is a sub-instance of one of the design modules in an embodiment of the disclosed invention that allows sub-instances. If it is not, then the invention proceeds to step 407, which writes an instance of instance next_inst into the test bench file and goes to step 402. If it is, then there is no need to create an instance, since the instance which instantiates next_inst will already contain the wiring information for it, so the invention proceeds directly to step 402. If step 405 determined that there are unprocessed ports of instance next_inst, then the invention assigns the next unprocessed port to the variable next_port in step 408 and proceeds to step 409, which asks whether port next_port of instance next_inst is an input port. If it is not, the invention goes to step 412, otherwise the invention proceeds to step 410, which asks whether instance next_inst is a sub-instance of a design module in an embodiment of the invention that allows sub-instances. If it is a sub-instance, the invention ignores input wires, since the invention will not create an instance of next_inst in the test bench, and proceeds to step 405. If it is not a sub-instance, the invention goes to step 411, which creates reference wires for port next_port of instance next_inst and then returns to step 405. Step 412 creates reference wires for comparing against output port next_port of instance next_inst and goes to step 413. The process used by step 411 and step 412 is described in FIG. 14. In step 413, the invention writes a wire for output port next_port of instance next_inst into the test bench file. For an embodiment of the invention that supports design delays, the invention then write a series of latches to delay the output by the design delay for port next_port of instance next_inst. For an embodiment of the invention that supports shifting signals to the correct phase of a multi-phased clock, the invention then writes the logic to shift the delayed output signal to the correct phase. Finally, the invention writes the logic to check the phase-shifted, encoded, delayed reference signal created in step 412 against the phase-shifted, delayed output signal. Finally, the invention returns to step 405.

Figure 14:
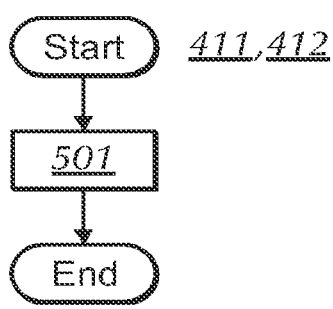
FIG. 14 illustrates the process of step 411 and step 412 of FIG. 13.

FIG. 14 illustrates the process of step 411 and step 412 of FIG. 13. In this step 501, the invention writes a wire from the reference port corresponding to port next_port of instance next_inst. For an embodiment of the invention that supports reference delays, the invention then write a series of latches to delay the reference wire by the reference delay for port next_port of instance next_inst. For an embodiment of the invention that supports encoding reference signals to correspond to design signals, the invention then writes the logic to encode the delayed reference wire. For an embodiment of the invention that supports shifting signals to the correct phase of a multi-phased clock, the invention then writes the logic to shift the encoded, delayed reference wire to the correct phase.

To summarize, this invention describes a method that generates and uses a test bench for verifying an electrical design module in semiconductor manufacturing against an electrical reference model containing a sub-circuit that matches the electrical design module. The invention comprises providing a description of an electrical design module that includes a plurality of ports. In addition, the invention includes providing a description of an electrical reference model that comprises a hierarchy of one or more reference modules where each reference module comprises a plurality of ports and a plurality of internal wires. The invention further includes providing and or creating one or more implicit defines for the reference modules that appear in hierarchy of the electrical reference model where each implicit define comprises a path through the hierarchy of the electrical reference model to the module so defined. And, the invention includes providing a description file that includes one or more instance definitions, wherein each instance definition contains a plurality of port definitions, each port definition contains the name of a port of the electrical design module and a reference connection, the reference connection contains the name of a single implicit define being also the name of a module within the electrical reference model and the name of the port on the module within the electrical reference model. The invention parses the hierarchy of the electrical design model and then processes the description file. The invention then writes the test bench containing logic to drive each input port of the electrical design module with the port of the reference module to which it maps and to check at each clock cycle each output port of the electrical design module against the port of the reference module to which it maps and to record in the test bench that each of the plurality of ports of the electrical design module matches its corresponding port of the reference module.

Further refining the invention, the implicit defines are generated for each reference module that appears uniquely in the hierarchy of the electrical reference model. In addition, the reference connection comprises the name of an implicit define and the name of an internal wire in the module within the electrical reference model. Further, each said port definition within the description file further specifies an encoding function to apply to the reference connection. Additionally, each port definition further specifies that the reference connection be delayed by an integral number of clock cycles. Further, each port definition further specifies that the port on the electrical design model be delayed by an integral number of clock cycles. And, the reference connection specifies a Boolean combination of one or more reference signals where each reference signal comprises a signal or port in the electrical reference module.

Other embodiments of the present invention will be apparent to those skilled in the art after considering this disclosure or practicing the disclosed invention. The specification and examples above are exemplary only, with the true scope of the present invention being determined by the following claims.

The invention claimed is:

1. A method, comprising:
processing a description file that specifies relationships between ports of instances within an electrical design model and corresponding ports of one or more reference modules of an electrical reference model, the processing being performed by one or more computers; and
dependent on said processing, generating a test bench for verifying the electrical design module, the generating the test bench being performed by one or more computers, wherein generating the test bench comprises one or more of:
generating, within the test bench, a logical representation of one or more delay elements, wherein the one or more delay elements are configured to delay either a value of a reference output port of the electrical reference model or a value of a corresponding design output port of the electrical design model prior to comparison of the value of the reference output port with the value of the corresponding design output port of the electrical design model; or
generating, within the test bench, a logical representation of one or more phase-shifting elements, wherein the one or more phase-shifting elements are configured to shift either the value of the reference output port of the electrical reference model or the value of the corresponding design output port of the electrical to a specified clock phase prior to comparison of the value of the reference output port with the value of the corresponding design output port of the electrical design model.

2. The method of claim 1, wherein generating the test bench further comprises generating, within the test bench, a logical representation of one or more logic elements configured to compare the value of the reference output port with the value of the corresponding design output port of the electrical design model.

3. The method of claim 1, wherein the description file comprises a port definition corresponding to the design output port of the electrical design model, wherein the port definition comprises a reference connection that establishes a correspondence between the design output port of the electrical design model and the reference output port of the electrical reference model.

4. The method of claim 3, wherein the reference connection refers to the reference output port of the electrical reference model using an implicit define.

5. The method of claim 3, wherein the port definition further comprises one or more of: an encoding function that specifies a manner of encoding the value of the reference output port prior to comparison to the design output port, a phase parameter that specifies the clock phase of either the reference output port or the corresponding design output port, or a delay parameter that specifies a delay corresponding to either the reference output port or the corresponding design output port.

6. The method of claim 1, wherein generating the test bench further comprises generating, within the test bench, computer-executable code that is configured to:
check, on a clock-cycle basis, one or more output ports of the electrical design model against one or more corresponding ports of the electrical reference model; and
record, for each given one of the one or more output ports, an indication of whether the given output port matches a corresponding port of the electrical reference model.

7. A method, comprising:
dependent upon a description file that specifies relationships between ports of instances within an electrical design model and corresponding ports of one or more reference modules of an electrical reference model, generating a first test bench that instantiates one or more instances of the electrical design model, wherein the first test bench includes executable code that checks the one of more instances of the electrical design model against one or more reference modules located at a given level of hierarchy within the electrical reference model, the generating the first test bench being performed by one or more computers; and
dependent upon the description file, generating a second test bench that instantiates the one or more instances of the electrical design model, wherein the second test bench includes executable code that checks the one of more instances of the electrical design model against one or more reference modules located at a different level of hierarchy within the electrical reference model, the generating the second test bench being performed by one or more computers;
wherein the description file includes one or more implicit defines, wherein each implicit define refers to a reference port of the electrical reference model via a path through a hierarchy of the electrical reference model.

8. The method of claim 7, wherein for a given one of the first test bench or the second test bench, generating the given test bench comprises generating, within the given test bench, a logical representation of one or more delay elements, wherein the one or more delay elements are configured to delay either a value of a reference output port of the electrical reference model or a value of a corresponding design output port of the electrical design model prior to comparison of the value of the reference output port with the value of the corresponding design output port of the electrical design model.

9. The method of claim 7, wherein for a given one of the first test bench or the second test bench, generating the given test bench comprises generating, within the given test bench, a logical representation of one or more phase-shifting elements, wherein the one or more phase-shifting elements are configured to shift either the value of the reference output port of the electrical reference model or the value of the corresponding design output port of the electrical to a specified clock phase prior to comparison of the value of the reference output port with the value of the corresponding design output port of the electrical design model.

10. The method of claim 7, wherein for a given relationship between a given design port of the electrical design model and a corresponding given reference port of the electrical reference model, the description file includes one or more of: an encoding function that specifies a manner of encoding a value of the given reference port prior to comparison to the given design port, a phase parameter that specifies a clock phase of either the given reference port or the given design port, or a delay parameter that specifies a delay corresponding to either the given reference port or the given design port.

11. A program storage device readable by a computing device that tangibly embodies a program of instructions executable by the computing device to:
process a description file that specifies relationships between ports of instances within an electrical design model and corresponding ports of one or more reference modules of an electrical reference model, the relationships including one or more implicit defines, wherein each of the one or more implicit defines includes a path through the hierarchy of the electrical reference model to a respective one of the one or more reference modules; and dependent on the description file, generate a test bench for verifying the electrical design module.

12. The program storage device of claim 11, wherein to generate the test bench, the instructions are further executable to generate code that is computer-executable to:

drive one or more input ports of the electrical design module with values presented to one or more corresponding ports of the electrical reference model;

check, on a clock-cycle basis, one or more output ports of the electrical design model against one or more corresponding ports of the electrical reference model; and record, for each given one of the one or more output ports, an indication of whether the given output port matches a corresponding port of the electrical reference model.

13. The program storage device of claim 11, wherein to generate the test bench, the instructions are further executable to generate, within the test bench, a logical representation of one or more delay elements, wherein the one or more delay elements are configured to delay either a value of a reference output port of the electrical reference model or a value of a corresponding design output port of the electrical design model prior to comparison of the value of the reference output port with the value of the corresponding design output port of the electrical design model.

14. The program storage device of claim 11, wherein to generate the test bench, the instructions are further executable to generate, within the test bench, a logical representation of one or more phase-shifting elements, wherein the one or more phase-shifting elements are configured to shift either the value of the reference output port of the electrical reference model or the value of the corresponding design output port of the electrical to a specified clock phase prior to comparison of the value of the reference output port with the value of the corresponding design output port of the electrical design model.

15. The program storage device of claim 14, wherein for a given relationship between a given design port of the electrical design model and a corresponding given reference port of the electrical reference model, the description file includes one or more of: an encoding function that specifies a manner of encoding a value of the given reference port prior to comparison to the given design port, a phase parameter that specifies a clock phase of either the given reference port or the given design port, or a delay parameter that specifies a delay corresponding to either the given reference port or the given design port.

16. A program storage device readable by a computing device that tangibly embodies a program of instructions executable by the computing device to:

dependent upon a description file that specifies relationships between ports of instances within an electrical design model and corresponding ports of one or more reference modules of an electrical reference model, generate a first test bench that instantiates one or more instances of the electrical design model, wherein the first test bench includes executable code that checks the one of more instances of the electrical design model against one or more reference modules located at a given level of hierarchy within the electrical reference model; and dependent upon the description file, generate a second test bench that instantiates the one or more instances of the electrical design model, wherein the second test bench includes executable code that checks the one of more instances of the electrical design model against one or more reference modules located at a different level of hierarchy within the electrical reference model;

wherein for a given relationship between a given design port of the electrical design model and a corresponding given reference port of the electrical reference model, the description file includes one or more of: an encoding function that specifies a manner of encoding a value of the given reference port prior to comparison to the given design port, a phase parameter that specifies a clock phase of either the given reference port or the given design port, or a delay parameter that specifies a delay corresponding to either the given reference port or the given design port.

17. The program storage device of claim 16, wherein the description file includes one or more implicit defines, wherein each implicit define refers to a reference port of the electrical reference model via a path through a hierarchy of the electrical reference model.

18. The program storage device of claim 16, wherein to generate a given one of either the first test bench or the second test bench, the instructions are further executable to generate, within the given test bench, a logical representation of one or more logic elements configured to compare a value of a reference output port of the electrical reference model with a value of a corresponding design output port of the electrical design model.

19. The program storage device of claim 16, wherein the description file indicates that either a given output port of the electrical design model or a given corresponding port of the electrical reference model be delayed by an integral number of clock cycles prior to comparing the given output port to the given corresponding port.

20. The program storage device of claim 16, wherein the description file includes an indication that one or more features of the electrical reference model be disabled, wherein the indication comprises specifying that one or more input ports of the electrical reference model be driven with constant values.

\* \* \* \* \*